(12) United States Patent
Yan et al.

(10) Patent No.: US 8,093,809 B2
(45) Date of Patent: Jan. 10, 2012

(54) ELECTROLUMINESCENT DISPLAY DEVICE

(75) Inventors: Li-Jia Yan, Shenzhen (CN);
Kuan-Hong Hsieh, Taipei Hsien (TW);
Chun-Wei Pan, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 95 days.

(21) Appl. No.: 12/768,698

(22) Filed: Apr. 27, 2010

(65) Prior Publication Data
US 2011/0068684 A1  Mar. 24, 2011

(30) Foreign Application Priority Data
Sep. 23, 2009  (CN) .......................... 2009 1 0307534

(51) Int. Cl.
*H05B 33/00* (2006.01)
(52) U.S. Cl. ........................................ 313/506; 313/503
(58) Field of Classification Search .................... None
See application file for complete search history.

(56) References Cited

U.S. PATENT DOCUMENTS

| | | | |
|---|---|---|---|
| 2003/0164679 A1* | 9/2003 | Hamano et al. | 313/504 |
| 2005/0206308 A1* | 9/2005 | Takahashi et al. | 313/504 |
| 2009/0179546 A1* | 7/2009 | Shinoda et al. | 313/484 |

\* cited by examiner

*Primary Examiner* — Ashok Patel
(74) *Attorney, Agent, or Firm* — Altis Law Group, Inc.

(57) ABSTRACT

A color electroluminescent (EL) display device comprises a transparent substrate, and a transparent electrode arranged on the transparent substrate. The EL display also includes an electroluminescent layer arranged on the transparent electrode that comprises a plurality of pixel units. Each pixel unit comprises at least two regions comprising electroluminescent materials capable of emitting light of different colors. The EL display further comprises a plurality of opposing electrodes arranged on the electroluminescent layer. Each of the opposing electrodes cooperates with the transparent electrode to apply a voltage to one of the at least two regions of each pixel unit.

9 Claims, 2 Drawing Sheets

ELECTROLUMINESCENT DISPLAY DEVICE

BACKGROUND

1. Technical Field

The present disclosure relates to electroluminescent display devices and, more particularly, to a color electroluminescent display device.

2. Description of Related Art

Flat panel displays such as liquid crystal displays (LCD) are well known. LCD display devices can display colorful images. An LCD display generally includes a backlight module, which causes difficulties in reducing the total thickness of the LCD display. Therefore, it is desirable to provide a thinner flat panel display, such as an electroluminescent (EL) display device that can display colorful images.

BRIEF DESCRIPTION OF THE DRAWINGS

The components in the drawings are not necessarily drawn to scale, the emphasis instead being placed upon clearly illustrating the principles of the electroluminescent display device. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
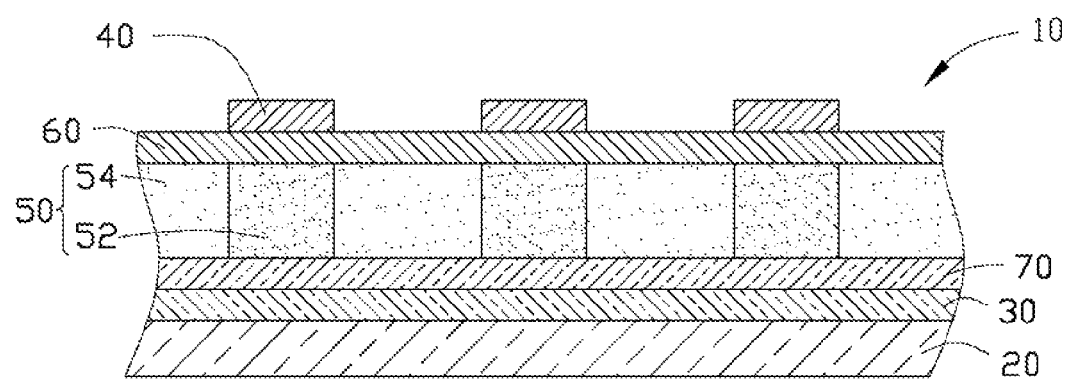
FIG. 1 is a schematic cross-sectional view of an electroluminescent display device in accordance with an exemplary embodiment.

Referring to FIG. 1, an electroluminescent (EL) display 10 includes a substrate 20, a transparent electrode 30, a plurality of opposing electrodes 40, and an electroluminescent layer 50. In the embodiment, the substrate 20 is made of glass. In an alternative embodiment, the substrate 20 may be made of other suitable material. The substrate 20 is transparent to provide a viewing surface through which a user can view images formed by the electroluminescent layer 50.

The transparent electrode 30 is arranged on the substrate 20. In the exemplary embodiment, the transparent electrode 30 is a thin sheet made of indium tin oxide (ITO). The transparent electrode 30 is shaped to match the substrate 20.

Figure 2:
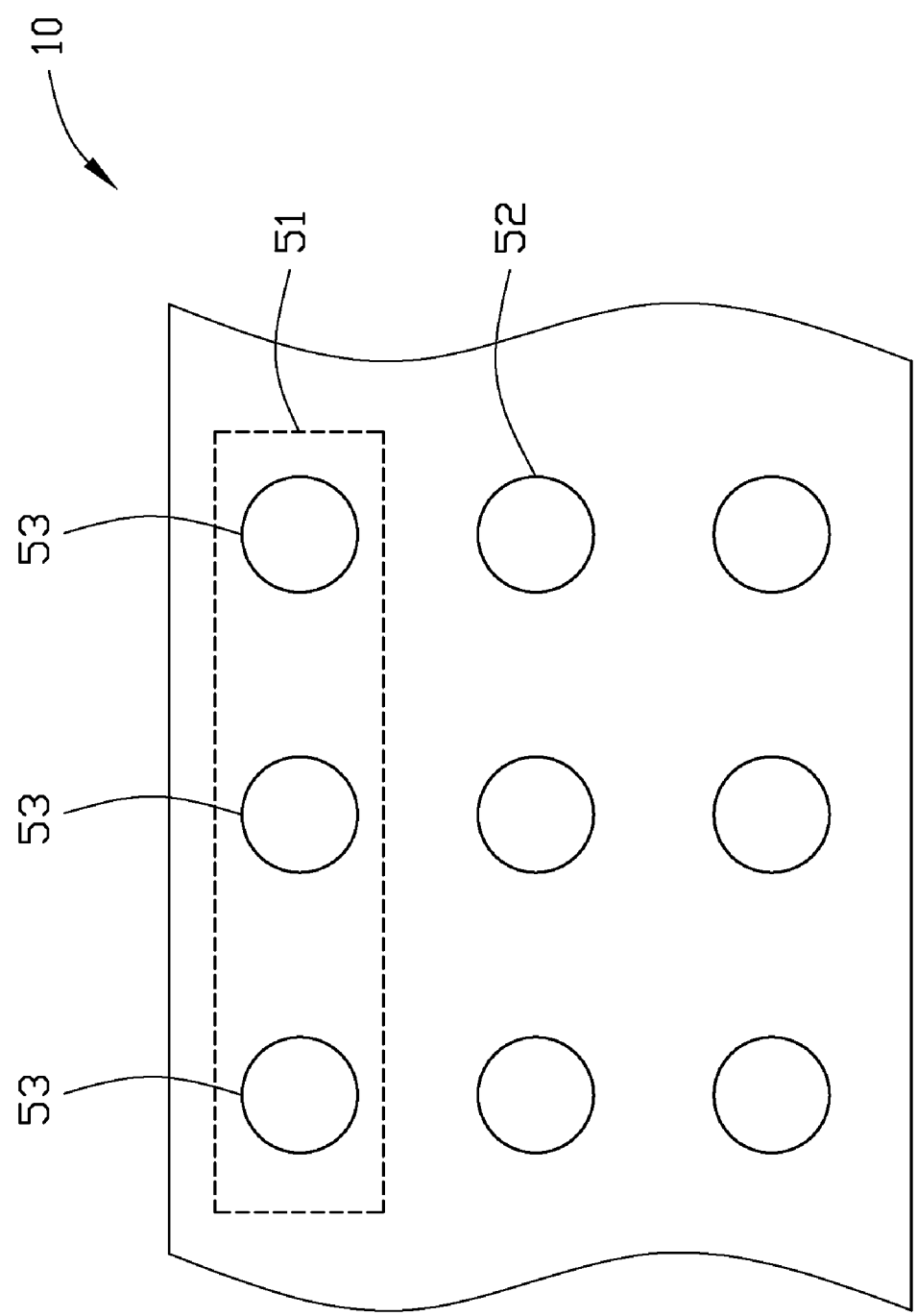
FIG. 2 is schematic planar view of the electroluminescent display device of FIG. 1.

Referring to FIG. 1 and FIG. 2, the electroluminescent layer 50 is arranged on the transparent electrode 30 and can be made of any suitable transparent material. The electroluminescent layer 50 includes a base body 54 and a plurality of cavities 52 defined in the base body 54 to accommodate electroluminescent materials. The plurality of cavities 52 are arranged in a matrix pattern. Each of the cavities 52 is shaped in cylinder and has a circular opening in the electroluminescent layer 50.

Moreover, the electroluminescent layer 50 includes a plurality of pixel units 51. Each pixel unit 51 includes three adjacent cavities 52 which accommodate electroluminescent materials. The electroluminescent materials can be activated to emit lights of primary colors, that is, red, green, and blue light (RGB). Each pixel unit 51 includes three color regions 53. The three color regions 53 can be controlled to display RGB colors, respectively, which can be combined to form a desirable color. The pixel unit 51 thus displays the desirable color.

The opposing electrodes 40 are arranged on the electroluminescent layer 50. In the exemplary embodiment, each electrode 40 is aligned with one cavity 52, which cooperates with the transparent electrode 30 to apply a voltage to the electroluminescent material in the cavity 52, to cause the electroluminescent material to emit light.

In the exemplary embodiment, to prevent a short circuit, a first protective layer 60 is arranged between the opposing electrodes 40 and the electroluminescent layer 50. Similarly, a second protective layer 70 is arranged between the transparent electrode 30 and the electroluminescent layer 50. In the exemplary embodiment, the first protective layer 60 and the second protective layer 70 can be made of $Ta_2O_5$.

To form a desirable colorful image, certain pixel units 51 each need to display a predetermined color. For example, if a pixel unit 51 needs to display a yellow color, the red and green regions 53 in the pixel unit 51 need to display red and green colors, which combine to form a yellow color according to color mixing theory. One of the three opposing electrodes 40 corresponding to the pixel unit 51 is controlled to have a potential identical to the transparent electrode 30, such that the corresponding electroluminescent material will not be activated to emit blue light. While, the other two opposing electrodes 40 are controlled to cooperate with the transparent electrode 30 to apply voltages to cause the corresponding electroluminescent materials to emit red and green light, respectively. The pixel unit 51 thus displays a yellow color.

Each pixel unit 51 can display different colors by applying different magnitude of voltages to the electroluminescent materials in the three cavities 52 of each pixel unit 51. Specifically, by applying different magnitude of voltages, the electroluminescent materials in each cavity 52 can be caused to display colors of different levels. The pixel unit 51 can thus display different colors by mixing the lights of different colors emitting by the electroluminescent materials in the three cavities 52.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A color electroluminescent display device comprising:
   a transparent substrate;
   a transparent electrode arranged on the transparent substrate;
   an electroluminescent layer arranged on the transparent electrode comprising a plurality of pixel units, each pixel unit comprising a plurality of cavities to accommodate electroluminescent materials capable of emitting light of different colors, each of the cavities is shaped in cylinder and having a circular opening in the electroluminescent layer; and
   a plurality of opposing electrodes arranged on the electroluminescent layer, each of the opposing electrodes cooperating with the transparent electrode to apply a voltage to one of the at least two regions of each pixel unit.

2. The color electroluminescent display device according to claim 1, wherein each pixel unit comprises three regions comprising three kind of electroluminescent materials emitting red, green, and blue light, respectively.

3. The color electroluminescent display device according to claim 1, wherein the transparent electrode is made of indium tin oxide.

4. The color electroluminescent display device according to claim 1, wherein the plurality of cavities are arranged in a matrix pattern.

5. The color electroluminescent display device according to claim 1, wherein the transparent substrate is made of glass.

6. The color electroluminescent display device according to claim 1 further comprising a first protective layer arranged between the electroluminescent layer and the opposing electrodes.

7. The color electroluminescent display device according to claim 6, wherein the first protective layer is made of $Ta_2O_5$.

8. The color electroluminescent display device according to claim 1 further comprising a second protective layer arranged between the transparent electrode and the electroluminescent layer.

9. The color electroluminescent display device according to claim 8, wherein the second protective layer is made of $Ta_2O_5$.

* * * * *